United States Patent
Li et al.

(10) Patent No.: US 11,022,899 B2
(45) Date of Patent: Jun. 1, 2021

(54) METHOD OF MEASURING A FOCUS PARAMETER RELATING TO A STRUCTURE FORMED USING A LITHOGRAPHIC PROCESS

(71) Applicant: ASML Netherlands B.V., Veldhoven (NL)

(72) Inventors: Fahong Li, Eindhoven (NL); Sergei Sokolov, Utrecht (NL)

(73) Assignee: ASML Netherlands B.V., Veldhoven (NL)

(*) Notice: Subject to any disclaimer, the term of this patent is extended or adjusted under 35 U.S.C. 154(b) by 0 days.

(21) Appl. No.: 16/693,453

(22) Filed: Nov. 25, 2019

(65) Prior Publication Data

US 2020/0166335 A1    May 28, 2020

(30) Foreign Application Priority Data

Nov. 26, 2018 (EP) .................................. 18208291

(51) Int. Cl.
*G03F 7/20* (2006.01)
*G01B 11/27* (2006.01)

(52) U.S. Cl.
CPC ........ *G03F 7/70641* (2013.01); *G01B 11/272* (2013.01); *G03F 7/70625* (2013.01); *G03F 7/70633* (2013.01)

(58) Field of Classification Search
CPC .. G03F 7/705; G03F 7/70508; G03F 7/70516; G03F 7/70525; G03F 7/70533; G03F 7/7055; G03F 7/70558; G03F 7/70556; G03F 7/70575; G03F 7/70591; G03F 7/706; G03F 7/70608; G03F 7/70616; G03F 7/70625; G03F 7/70633; G03F 7/70641; G03F 7/7065; G03F 7/70683; G01B 11/02; G01B 11/06; G01B 11/14; G01B 11/26; G01B 11/27; G01B 11/272;

(Continued)

(56) References Cited

U.S. PATENT DOCUMENTS

| 7,747,978 B2 * | 6/2010 | Ye ........................... G03F 7/705 |
| | | 716/50 |
| 8,823,922 B2 | 9/2014 | Den Boef |
| 10,352,875 B2 | 7/2019 | Fukazawa et al. |

(Continued)

FOREIGN PATENT DOCUMENTS

| TW | 201003332 A | 1/2010 |
| TW | 201217770 A | 5/2012 |

(Continued)

OTHER PUBLICATIONS

International Search Report and Written Opinion of the International Searching Authority directed to related International Patent Application No. PCT/EP2019/078172, dated Nov. 27, 2019; 13 pages.

*Primary Examiner* — Gordon J Stock, Jr.
(74) *Attorney, Agent, or Firm* — Sterne, Kessler, Goldstein & Fox P.L.L.C.

(57) ABSTRACT

Disclosed is a method of measuring a focus parameter relating to formation of a structure using a lithographic process, and associated metrology device. The method comprises obtaining measurement data relating to a cross-polarized measurement of said structure; and determining a value for said focus parameter based on the measurement data.

13 Claims, 3 Drawing Sheets

(58) Field of Classification Search
CPC ........... G01N 21/8422; G01N 21/8501; G01N 21/956; G01N 21/95607
See application file for complete search history.

(56) References Cited

U.S. PATENT DOCUMENTS

| | | | |
|---|---|---|---|
| 10,453,758 | B2 | 10/2019 | Van Leest et al. |
| 2003/0206298 | A1 | 11/2003 | Bischoff et al. |
| 2005/0195413 | A1 | 9/2005 | Brill |
| 2006/0033921 | A1 | 2/2006 | Den Boef et al. |
| 2006/0066855 | A1 | 3/2006 | Boef et al. |
| 2008/0279442 | A1* | 11/2008 | Den Boef ................. G03F 1/84 382/144 |
| 2010/0201963 | A1 | 8/2010 | Cramer et al. |
| 2011/0027704 | A1 | 2/2011 | Cramer et al. |
| 2011/0043791 | A1 | 2/2011 | Smilde et al. |
| 2011/0102753 | A1 | 5/2011 | Van De Kerkhof et al. |
| 2011/0249244 | A1 | 10/2011 | Leewis et al. |
| 2012/0044470 | A1 | 2/2012 | Smilde et al. |
| 2012/0123581 | A1 | 5/2012 | Smilde et al. |
| 2013/0114081 | A1* | 5/2013 | Fukazawa .......... G01N 21/9501 356/369 |
| 2013/0215404 | A1* | 8/2013 | Den Boef ............ G01J 3/4412 355/44 |
| 2013/0217154 | A1* | 8/2013 | Fukazawa .......... G01N 21/9501 438/7 |
| 2013/0258310 | A1 | 10/2013 | Smilde et al. |
| 2013/0271740 | A1 | 10/2013 | Quintanilha |
| 2014/0315330 | A1* | 10/2014 | Fujimori ................ G03F 7/7085 438/7 |
| 2015/0338745 | A1* | 11/2015 | Fukazawa ........... G03F 7/70625 355/77 |
| 2017/0184977 | A1* | 6/2017 | Jak ........................ G03F 7/7085 |
| 2017/0248852 | A1* | 8/2017 | Warnaar .............. G03F 7/70133 |
| 2017/0255112 | A1* | 9/2017 | Van Leest ............ G03F 7/70633 |
| 2017/0255738 | A1 | 9/2017 | Van Leest et al. |
| 2019/0086810 | A1 | 3/2019 | Tel et al. |
| 2020/0133140 | A1* | 4/2020 | Warnaar ................. G01N 21/21 |

FOREIGN PATENT DOCUMENTS

| | | |
|---|---|---|
| TW | 201743141 A | 12/2017 |
| TW | 201832020 A | 9/2018 |
| WO | WO 2009/078708 A1 | 6/2009 |
| WO | WO 2009/106279 A1 | 9/2009 |
| WO | WO 2009/156225 A1 | 12/2009 |
| WO | WO 2013/178422 A1 | 12/2013 |

* cited by examiner

METHOD OF MEASURING A FOCUS PARAMETER RELATING TO A STRUCTURE FORMED USING A LITHOGRAPHIC PROCESS

FIELD OF THE INVENTION

The present invention relates to methods and apparatus for measuring applied patterns to a substrate in a lithographic process.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to monitor the lithographic process, parameters of the patterned substrate are measured. Parameters may include, for example, the overlay error between successive layers formed in or on the patterned substrate and critical linewidth (CD) of developed photosensitive resist. This measurement may be performed on a product substrate and/or on a dedicated metrology target. There are various techniques for making measurements of the microscopic structures formed in lithographic processes, including the use of scanning electron microscopes and various specialized tools. A fast and non-invasive form of specialized inspection tool is a scatterometer in which a beam of radiation is directed onto a target on the surface of the substrate and properties of the scattered or reflected beam are measured. Two main types of scatterometer are known. Spectroscopic scatterometers direct a broadband radiation beam onto the substrate and measure the spectrum (intensity as a function of wavelength) of the radiation scattered into a particular narrow angular range. Angularly resolved scatterometers use a monochromatic radiation beam and measure the intensity of the scattered radiation as a function of angle.

Examples of known scatterometers include angle-resolved scatterometers of the type described in US2006033921A1 and US2010201963A1. The targets used by such scatterometers are relatively large, e.g., 40 µm by 40 µm, gratings and the measurement beam generates a spot that is smaller than the grating (i.e., the grating is underfilled). In addition to measurement of feature shapes by reconstruction, diffraction based overlay can be measured using such apparatus, as described in published patent application US2006066855A1. Diffraction-based overlay metrology using dark-field imaging of the diffraction orders enables overlay measurements on smaller targets. Examples of dark field imaging metrology can be found in international patent applications WO 2009/078708 and WO 2009/106279 which documents are hereby incorporated by reference in their entirety. Further developments of the technique have been described in published patent publications US20110027704A, US20110043791A, US2011102753A1, US20120044470A, US20120123581A, US20130258310A, US20130271740A and WO2013178422A1. These targets can be smaller than the illumination spot and may be surrounded by product structures on a wafer. Multiple gratings can be measured in one image, using a composite grating target. The contents of all these applications are also incorporated herein by reference.

In performing lithographic processes, such as application of a pattern on a substrate or measurement of such a pattern, process control methods are used to monitor and control the process. Such process control techniques are typically performed to obtain corrections for control of the lithographic process.

One important parameter which should be monitored is focus of the projection optics on the substrate when performing an exposure. For a number of reasons, this focus can drift over time and over the substrate (e.g., because the substrate is not perfectly flat). Focus monitoring typically comprises measuring structures having assist features or sub-resolution features (smaller than the imaging resolution of the projection optics). These sub-resolution features, while not imaged, affect the main structure by imposing an asymmetry which is dependent on focus. Therefore, measuring of this asymmetry (e.g., using a scatterometer) means that the focus can be inferred. However, such methods are difficult to implement for EUV lithography, due to the thin resists used. Additionally, the imaging of sub-resolution features is undesirable for a number of reasons. Astigmatism based focus techniques have also been developed, but cannot be used in product monitoring, as it requires astigmatism (aberrated optics) in the projection lens during exposure.

It is desirable to address at least some of the issues raised above.

SUMMARY OF THE INVENTION

In a first aspect of the invention, there is provided a method of measuring a focus parameter relating to formation of a structure using a lithographic process, wherein said method comprises obtaining measurement data relating to a cross-polarized measurement of said structure; and determining a value for said focus parameter based on the measurement data.

In a second aspect of the invention, there is provided a computer program comprising program instructions operable to perform the method of the first aspect when run on a suitable apparatus.

In a third aspect of the invention, there is provided a processing system comprising a processor and a computer program product comprising the computer program of the second aspect.

In a fourth aspect of the invention there is provided a metrology system comprising: a substrate holder for a substrate; an illumination source for illuminating a structure on the substrate with radiation with an illumination polarization state selectable between a first polarization state and a second polarization state; a sensor for sensing scattered illumination from the structure with a sensing illumination state selectable between said first polarization state and said second polarization state; and the processing system of the third aspect.

Further aspects, features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example, with reference to the accompanying drawings in which.

DETAILED DESCRIPTION

Before describing embodiments of the invention in detail, it is instructive to present an example environment in which embodiments of the present invention may be implemented.

Figure 1:
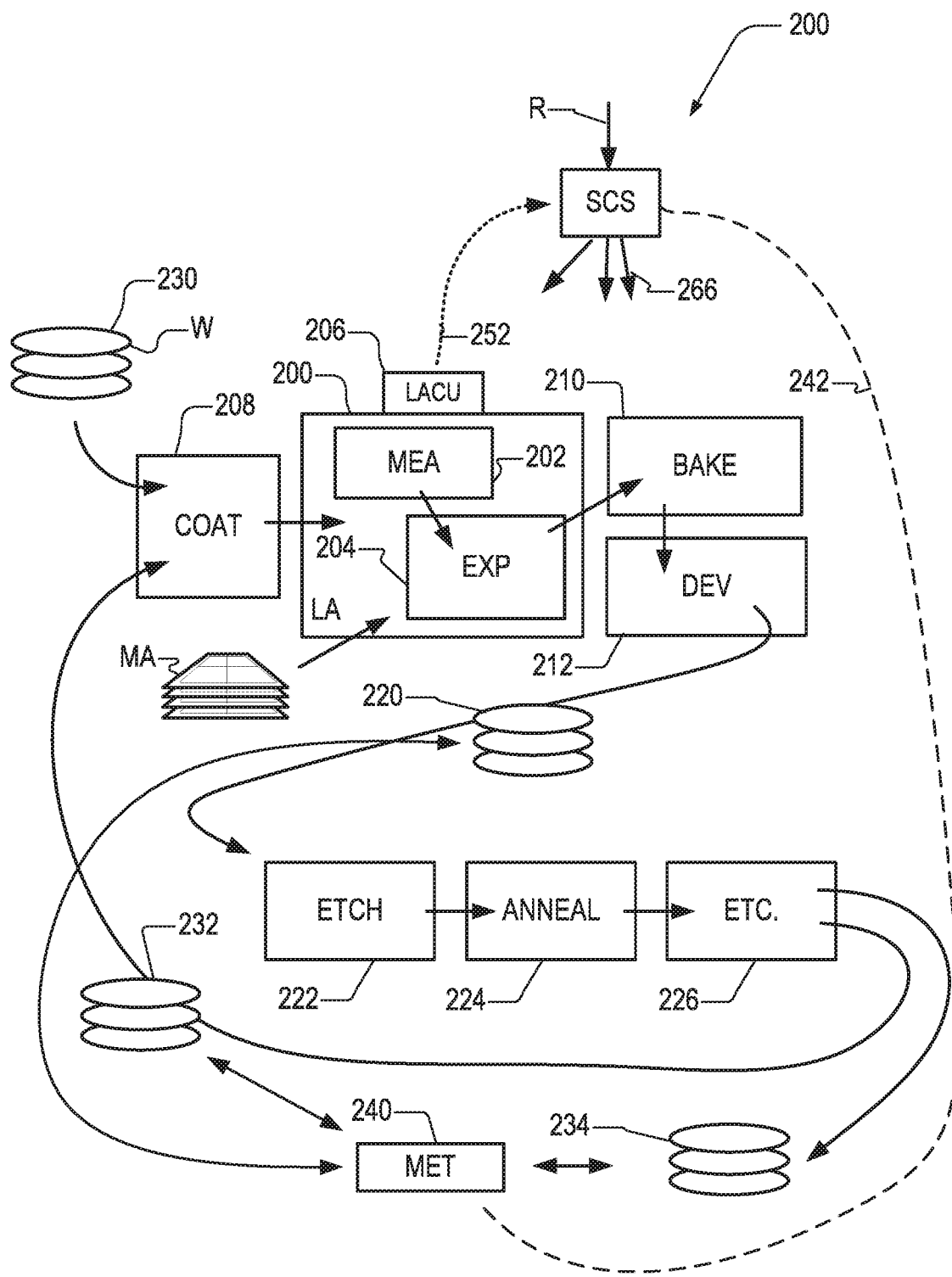
FIG. 1 depicts a lithographic apparatus together with other apparatuses forming a production facility for semiconductor devices.

FIG. 1 at 200 shows a lithographic apparatus LA as part of an industrial production facility implementing a high-volume, lithographic manufacturing process. In the present example, the manufacturing process is adapted for the manufacture of semiconductor products (integrated circuits) on substrates such as semiconductor wafers. The skilled person will appreciate that a wide variety of products can be manufactured by processing different types of substrates in variants of this process. The production of semiconductor products is used purely as an example which has great commercial significance today.

Within the lithographic apparatus (or "litho tool" 200 for short), a measurement station MEA is shown at 202 and an exposure station EXP is shown at 204. A control unit LACU is shown at 206. In this example, each substrate visits the measurement station and the exposure station to have a pattern applied. In an optical lithographic apparatus, for example, a projection system is used to transfer a product pattern from a patterning device MA onto the substrate using conditioned radiation and a projection system. This is done by forming an image of the pattern in a layer of radiation-sensitive resist material.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. The patterning MA device may be a mask or reticle, which imparts a pattern to a radiation beam transmitted or reflected by the patterning device. Well-known modes of operation include a stepping mode and a scanning mode. As is well known, the projection system may cooperate with support and positioning systems for the substrate and the patterning device in a variety of ways to apply a desired pattern to many target portions across a substrate. Programmable patterning devices may be used instead of reticles having a fixed pattern. The radiation for example may include electromagnetic radiation in the deep ultraviolet (DUV) or extreme ultraviolet (EUV) wavebands. The present disclosure is also applicable to other types of lithographic process, for example imprint lithography and direct writing lithography, for example by electron beam.

The lithographic apparatus control unit LACU which controls all the movements and measurements of various actuators and sensors to receive substrates W and reticles MA and to implement the patterning operations. LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus.

Before the pattern is applied to a substrate at the exposure station EXP, the substrate is processed in at the measurement station MEA so that various preparatory steps may be carried out. The preparatory steps may include mapping the surface height of the substrate using a level sensor and measuring the position of alignment marks on the substrate using an alignment sensor. The alignment marks are arranged nominally in a regular grid pattern. However, due to inaccuracies in creating the marks and also due to deformations of the substrate that occur throughout its processing, the marks deviate from the ideal grid. Consequently, in addition to measuring position and orientation of the substrate, the alignment sensor in practice must measure in detail the positions of many marks across the substrate area, if the apparatus is to print product features at the correct locations with very high accuracy. The apparatus may be of a so-called dual stage type which has two substrate tables, each with a positioning system controlled by the control unit LACU. While one substrate on one substrate table is being exposed at the exposure station EXP, another substrate can be loaded onto the other substrate table at the measurement station MEA so that various preparatory steps may be carried out. The measurement of alignment marks is therefore very time-consuming and the provision of two substrate tables enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations.

Within the production facility, apparatus 200 forms part of a "litho cell" or "litho cluster" that contains also a coating apparatus 208 for applying photosensitive resist and other coatings to substrates W for patterning by the apparatus 200. At an output side of apparatus 200, a baking apparatus 210 and developing apparatus 212 are provided for developing the exposed pattern into a physical resist pattern. Between all of these apparatuses, substrate handling systems take care of supporting the substrates and transferring them from one piece of apparatus to the next. These apparatuses, which are often collectively referred to as the track, are under the control of a track control unit which is itself controlled by a supervisory control system SCS, which also controls the lithographic apparatus via lithographic apparatus control unit LACU. Thus, the different apparatus can be operated to maximize throughput and processing efficiency. Supervisory control system SCS receives recipe information R which provides in great detail a definition of the steps to be performed to create each patterned substrate.

Once the pattern has been applied and developed in the litho cell, patterned substrates 220 are transferred to other processing apparatuses such as are illustrated at 222, 224, 226. A wide range of processing steps is implemented by various apparatuses in a typical manufacturing facility. For the sake of example, apparatus 222 in this embodiment is an etching station, and apparatus 224 performs a post-etch annealing step. Further physical and/or chemical processing steps are applied in further apparatuses, 226, etc. Numerous types of operation can be required to make a real device, such as deposition of material, modification of surface material characteristics (oxidation, doping, ion implantation etc.), chemical-mechanical polishing (CMP), and so forth. The apparatus 226 may, in practice, represent a series of different processing steps performed in one or more apparatuses. As another example, apparatus and processing steps may be provided for the implementation of self-aligned multiple patterning, to produce multiple smaller features based on a precursor pattern laid down by the lithographic apparatus.

As is well known, the manufacture of semiconductor devices involves many repetitions of such processing, to build up device structures with appropriate materials and patterns, layer-by-layer on the substrate. Accordingly, substrates 230 arriving at the litho cluster may be newly prepared substrates, or they may be substrates that have been processed previously in this cluster or in another apparatus entirely. Similarly, depending on the required processing, substrates 232 on leaving apparatus 226 may be returned for a subsequent patterning operation in the same litho cluster, they may be destined for patterning operations in a different cluster, or they may be finished products to be sent for dicing and packaging.

Each layer of the product structure requires a different set of process steps, and the apparatuses 226 used at each layer may be completely different in type. Further, even where the processing steps to be applied by the apparatus 226 are nominally the same, in a large facility, there may be several supposedly identical machines working in parallel to perform the step 226 on different substrates. Small differences in set-up or faults between these machines can mean that they influence different substrates in different ways. Even steps that are relatively common to each layer, such as etching (apparatus 222) may be implemented by several etching apparatuses that are nominally identical but working in parallel to maximize throughput. In practice, moreover, different layers require different etch processes, for example chemical etches, plasma etches, according to the details of the material to be etched, and special requirements such as, for example, anisotropic etching.

The previous and/or subsequent processes may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly a manufacturing facility in which litho cell LC is located also includes metrology system which receives some or all of the substrates W that have been processed in the litho cell. Metrology results are provided directly or indirectly to the supervisory control system SCS. If errors are detected, adjustments may be made to exposures of subsequent substrates, especially if the metrology can be done soon and fast enough that other substrates of the same batch are still to be exposed. Also, already exposed substrates may be stripped and reworked to improve yield, or discarded, thereby avoiding performing further processing on substrates that are known to be faulty. In a case where only some target portions of a substrate are faulty, further exposures can be performed only on those target portions which are good.

Also shown in FIG. 1 is a metrology apparatus 240 which is provided for making measurements of parameters of the products at desired stages in the manufacturing process. A common example of a metrology station in a modern lithographic production facility is a scatterometer, for example a dark-field scatterometer, an angle-resolved scatterometer or a spectroscopic scatterometer, and it may be applied to measure properties of the developed substrates at 220 prior to etching in the apparatus 222. Using metrology apparatus 240, it may be determined, for example, that important performance parameters such as overlay or critical dimension (CD) do not meet specified accuracy requirements in the developed resist. Prior to the etching step, the opportunity exists to strip the developed resist and reprocess the substrates 220 through the litho cluster. The metrology results 242 from the apparatus 240 can be used to maintain accurate performance of the patterning operations in the litho cluster, by supervisory control system SCS and/or control unit LACU 206 making small adjustments over time, thereby minimizing the risk of products being made out-of-specification, and requiring re-work.

Additionally, metrology apparatus 240 and/or other metrology apparatuses (not shown) can be applied to measure properties of the processed substrates 232, 234, and incoming substrates 230. The metrology apparatus can be used on the processed substrate to determine important parameters such as overlay or CD.

Figure 2A:
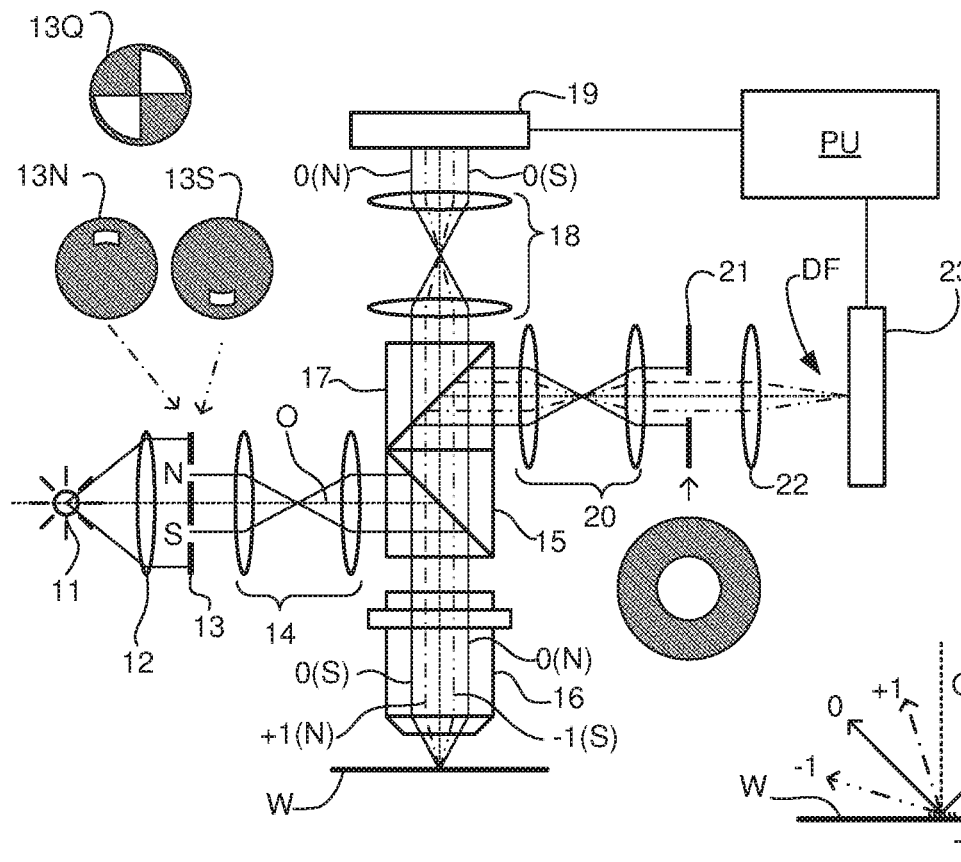
FIGS. 2(a)-2(b) comprise a schematic diagram of a scatterometer for use in measuring targets according to embodiments of the invention.

A metrology apparatus suitable for use in embodiments of the invention is shown in FIG. 2(a). This is purely an example of metrology apparatus and any suitable metrology apparatus may be used (e.g., for performing dark-field measurements). A target T and diffracted rays of measurement radiation used to illuminate the target are illustrated in more detail in FIG. 2(b). The metrology apparatus illustrated is of a type known as a dark field metrology apparatus. The metrology apparatus may be a stand-alone device or incorporated in either the lithographic apparatus LA, e.g., at the measurement station, or the lithographic cell LC. An optical axis, which has several branches throughout the apparatus, is represented by a dotted line O. In this apparatus, light emitted by source 11 (e.g., a xenon lamp) is directed onto substrate W via a beam splitter 15 by an optical system comprising lenses 12, 14 and objective lens 16. These lenses are arranged in a double sequence of a 4F arrangement. A different lens arrangement can be used, provided that it still provides a substrate image onto a detector, and simultaneously allows for access of an intermediate pupil-plane for spatial-frequency filtering. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done by inserting an aperture plate 13 of suitable form between lenses 12 and 14, in a plane which is a back-projected image of the objective lens pupil plane. In the example illustrated, aperture plate 13 has different forms, labeled 13N and 13S, allowing different illumination modes to be selected. The illumination system in the present examples forms an off-axis illumination mode. In the first illumination mode, aperture plate 13N provides off-axis from a direction designated, for the sake of description only, as 'north'. In a second illumination mode, aperture plate 13S is used to provide similar illumination, but from an opposite direction, labeled 'south'. Other modes of illumination are possible by using different apertures. An illumination mode described in some of the embodiments below is the quad illumination mode 13Q, also illustrated, which separates higher diffraction orders (e.g., +1 and −1) into diagonally opposed quadrants of the image, with the zeroth order directed to the other two quadrants. The rest of the pupil plane is desirably dark as any unnecessary light outside the desired illumination mode will interfere with the desired measurement signals.

Figure 2B:
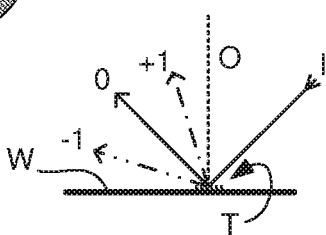

As shown in FIG. 2(b), target T is placed with substrate W normal to the optical axis O of objective lens 16. The substrate W may be supported by a support (not shown). A ray of measurement radiation I impinging on target T from an angle off the axis O gives rise to a zeroth order ray (solid line 0) and two first order rays (dot-chain line +1 and double dot-chain line −1). It should be remembered that with an overfilled small target, these rays are just one of many parallel rays covering the area of the substrate including metrology target T and other features. Since the aperture in plate 13 has a finite width (necessary to admit a useful quantity of light, the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown. Note that the grating pitches of the targets and the illumination angles can be designed or adjusted so that the first order rays entering the objective lens are closely aligned with the central optical axis. The rays illustrated in FIGS. 2(a) and 2(b) are shown somewhat off axis, purely to enable them to be more easily distinguished in the diagram.

At least the 0 and +1 orders diffracted by the target T on substrate W are collected by objective lens 16 and directed back through beam splitter 15. Returning to FIG. 2(a), both the first and second illumination modes are illustrated, by designating diametrically opposite apertures labeled as north (N) and south (S). When the incident ray I of measurement radiation is from the north side of the optical axis, that is when the first illumination mode is applied using aperture plate 13N, the +1 diffracted rays, which are labeled +1(N), enter the objective lens 16. In contrast, when the second illumination mode is applied using aperture plate 13S the −1 diffracted rays (labeled −1(S)) are the ones which enter the lens 16.

A second beam splitter 17 divides the diffracted beams into two measurement branches. In a first measurement branch, optical system 18 forms a diffraction spectrum (pupil plane image) of the target on first sensor 19 (e.g. a CCD or CMOS sensor) using the zeroth and first order diffractive beams. Each diffraction order hits a different point on the sensor, so that image processing can compare and contrast orders. The pupil plane image captured by sensor 19 can be used for many measurement purposes such as reconstruction used in methods described herein. The pupil plane image can also be used for focusing the metrology apparatus and/or normalizing intensity measurements of the first order beam.

In the second measurement branch, optical system 20, 22 forms an image of the target T on sensor 23 (e.g. a CCD or CMOS sensor). In the second measurement branch, an aperture stop 21 is provided in a plane that is conjugate to the pupil-plane. Aperture stop 21 functions to block the zeroth order diffracted beam so that the image of the target formed on sensor 23 is formed only from the −1 or +1 first order beam. Alternatively, wedges may be provided to create split images from the −1 and +1 first order beams simultaneously. The images captured by sensors 19 and 23 are output to processor PU which processes the image, the function of which will depend on the particular type of measurements being performed. Note that the term 'image' is used here in a broad sense. An image of the grating lines as such will not be formed, if only one of the −1 and +1 orders is present.

The particular forms of aperture plate 13 and field stop 21 shown in FIG. 2 are purely examples. In another embodiment of the invention, on-axis illumination of the targets is used and an aperture stop with an off-axis aperture is used to pass substantially only one first order of diffracted light to the sensor. In yet other embodiments, $2^{nd}$, $3^{rd}$ and higher order beams (not shown in FIG. 2) can be used in measurements, instead of or in addition to the first order beams.

The target T may comprise a number of gratings, which may have differently biased overlay offsets in order to facilitate measurement of overlay between the layers in which the different parts of the composite gratings are formed. The gratings may also differ in their orientation, so as to diffract incoming radiation in X and Y directions. Separate images of these gratings can be identified in the image captured by sensor 23. Once the separate images of the gratings have been identified, the intensities of those individual images can be measured, e.g., by averaging or summing selected pixel intensity values within the identified areas. Intensities and/or other properties of the images can be compared with one another. These results can be combined to measure different parameters of the lithographic process.

Figure 3:
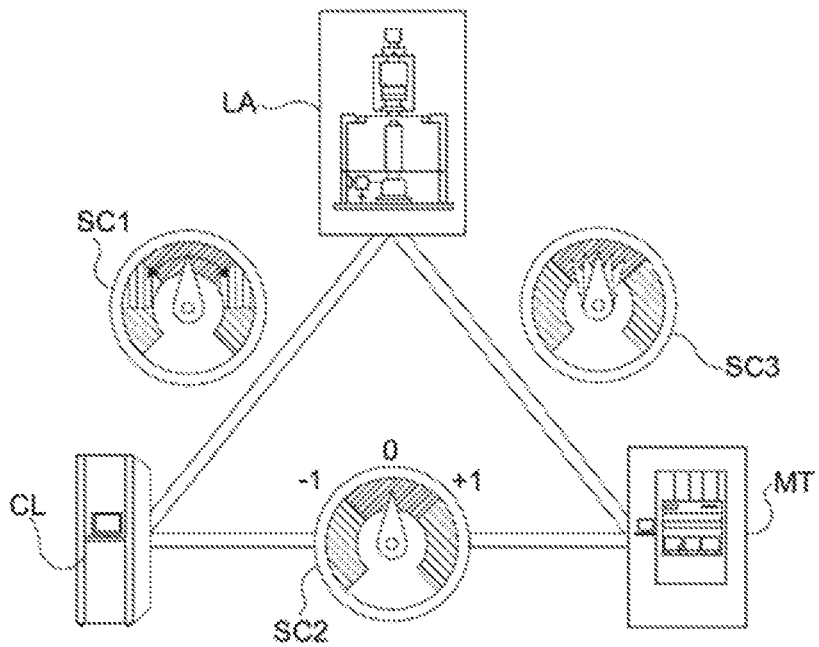
FIG. 3 depicts a schematic representation of holistic lithography, representing a cooperation between three key technologies to optimize semiconductor manufacturing.

Typically the patterning process in a lithographic apparatus LA is one of the most critical steps in the processing which requires high accuracy of dimensioning and placement of structures on the substrate W. To ensure this high accuracy, three systems may be combined in a so called "holistic" control environment as schematically depicted in FIG. 3. One of these systems is the lithographic apparatus LA which is (virtually) connected to a metrology tool MET (a second system) and to a computer system CL (a third system). The key of such "holistic" environment is to optimize the cooperation between these three systems to enhance the overall process window and provide tight control loops to ensure that the patterning performed by the lithographic apparatus LA stays within a process window. The process window defines a range of process parameters (e.g. dose, focus, overlay) within which a specific manufacturing process yields a defined result (e.g. a functional semiconductor device)—typically within which the process parameters in the lithographic process or patterning process are allowed to vary.

The computer system CL may use (part of) the design layout to be patterned to predict which resolution enhancement techniques to use and to perform computational lithography simulations and calculations to determine which mask layout and lithographic apparatus settings achieve the largest overall process window of the patterning process (depicted in FIG. 3 by the double arrow in the first scale SC1). Typically, the resolution enhancement techniques are arranged to match the patterning possibilities of the lithographic apparatus LA. The computer system CL may also be used to detect where within the process window the lithographic apparatus LA is currently operating (e.g. using input from the metrology tool MET) to predict whether defects may be present due to e.g. sub-optimal processing (depicted in FIG. 3 by the arrow pointing "0" in the second scale SC2).

The metrology tool MET may provide input to the computer system CL to enable accurate simulations and predictions, and may provide feedback to the lithographic apparatus LA to identify possible drifts, e.g. in a calibration status of the lithographic apparatus LA (depicted in FIG. 3 by the multiple arrows in the third scale SC3).

Focus monitoring is an important parameter for proper lithographic apparatus performance. In non-EUV systems, one method for monitoring focus is diffraction based focus (DBF). This comprises exposing structures with a deliberate focus dependent asymmetry. By measuring this asymmetry on the exposed structure, the focus at exposure can be inferred. However, DBF targets (on the reticle) comprise sub-resolution structures which can cause defects on the substrate and may not be compliant with some design rules. Also limitations, such as thin resist thicknesses, mean that DBF is not always suitable (or is at least more difficult to implement) for EUV systems. Astigmatism based focus (ABF) is an alternative method to DBF which provides a solution for EUV focus monitoring. However, such a method requires astigmatism to be induced in the imaging lens, which means it cannot be used for on-product metrology. To address these issues, an optical focus metrology technique will be described, which can measure a focus parameter (and optionally a dose parameter) on simple line-space targets, and which is suitable for on-product application. The focus parameter and dose parameter for a structure may describe the focus setting and dose setting respectively of the lithographic exposure apparatus (scanner) when exposing the structure.

The proposed method makes use of cross-polarization modes in a metrology (e.g., scatterometry) device. By using different cross-polarization modes, different measurement relationships with focus can be obtained, from which suitable relationships can be identified and used for the focus monitoring. A suitable relationship may be one that is monotonic over a sufficient focus range for focus monitoring of a lithographic process. What comprises a sufficient focus range will vary between scanner types. For a non-EUV scanner, a sufficient focal range may be 150 nm around best focus while for an EUV scanner, a sufficient focal range may be 90 nm around best focus. More generally, within the scope of this disclosure, a sufficient focal range around best focus may comprise, for example, any one of 250 nm, 200 nm, 150 nm, 120 nm, 100 nm, 90 nm, 70 nm or 50 nm; or any focus range in a range between 200 nm and 50 nm.

As such the metrology device may be operable in an illumination polarization state selectable between a first (e.g., horizontal) polarization state and a second (e.g., vertical) polarization state; and a sensor for sensing scattered illumination from the structure in a sensing illumination state selectable between said first polarization state and said second polarization state.

In particular, it is proposed that a set of polarimetric metrology measurements are performed. Using standard labelling convention (e.g., as used in radar imaging), a set of set of polarimetric metrology measurements may yield one, some or all of HH, VV, HV and VH polarization state measurement data, where, H and V refers respectively to horizontal and vertical polarization states, and:

HH—is horizontal transmit (e.g., illumination state) and horizontal receive (e.g., sensing state),
VV—is vertical transmit and vertical receive,
HV—is horizontal transmit and vertical receive, and
VH—is vertical transmit and horizontal receive.

Typically, each measurement of the set of set of polarimetric metrology measurements is obtained in a separate acquisition, e.g., by appropriately changing the polarizers within the metrology tool between acquisitions. However, in principle some of the polarization states can be acquired simultaneously, depending on the optical system being used. It may be possible, for example, to perform measurements simultaneously in HH and HV measurement states, and similarly VH and VV measurement states, where it is possible to split polarizations at the output.

The inventors have observed that the different polarized measurement states can each show a quite different focus response, providing a greater opportunity to find a suitable monotonic relationship between focus and measurement data such as measured intensity data (for example: one or more intensity values; e.g., intensities in the pupil plane and/or a darkfield intensity measurement (for example) of a diffraction order). In particular, measurement data may comprise derived or processed measurement data, which is derived from the measured intensities (intensity signal data), more specifically from the angle resolved intensities within the measured pupil. Such a processed signal may comprise a score of a principal component obtained from principal component analysis (PCA) processing of the measurement data (intensity signal data). Other methods for component analysis, processing and/or machine learning (e.g., artificial intelligence) algorithms may be used, however.

Such a method may comprise an initial calibration or learning phase to create a suitable focus model which can infer focus from measurement data related to at least one polarimetric metrology measurement. The calibration phase may be based on exposure and subsequent polarimetric or other cross-polarized measurement of an exposure matrix, such as typically exposed on an FEM wafer (focus-exposure matrix or focus-energy matrix wafer) to yield calibration measurement data, more specifically one or more of HV polarization state calibration measurement data, VH polarization state calibration measurement data, HH polarization state calibration measurement data and VV polarization state calibration measurement data.

The concept of an FEM wafer is known. Traditionally, optimal settings were determined by "send-ahead wafers" i.e. substrates that are exposed, developed and measured in advance of a production run. An FEM wafer comprises a wafer that has been coated with a photoresist onto which a pattern is exposed with multiple combinations of focus and exposure offsets. The FEM wafer is measured by the metrology tool to determine sidewall angles (SWA) and critical dimensions (CD) using e.g., reconstruction methods. A focus model or focus-dose model can then be constructed from these measurements and the known focus values (e.g., as set). A focus-dose model describes and interpolates the relationship between focus and dose and CD and SWA. With this interpolated model, any single CD and/or SWA measurement can be converted to focus and dose. Such a method is described, for example, in US patent application US2011-0249244, incorporated herein by reference in its entirety.

In this proposal, the FEM wafer follows a similar basic principal, but comprises a plurality of (e.g., symmetrical) line-space gratings, in fields exposed using different (known) focus and dose settings. In an embodiment, each field will comprise a plurality of different line-space gratings, varying in pitch and/or CDs. It is also proposed that a focus model (or focus dose model) be based on intensity measurements, rather than measurements requiring a full reconstruction. While the main embodiments below will describe a focus model, the skilled person will recognise that a focus dose model may be created to enable monitoring of focus and dose. In such a model, the FEM will include varied focus and dose, and the focus dose model created from measurements of the FEM in combination with the known focus and dose values.

FIG. 4 illustrates the advantage of using cross-polarization states. FIGS. 4(a) and 4(b) show plots of (largely unprocessed) measurement data, more specifically an average intensity (e.g., of a pupil or angularly resolved intensity distribution obtained in a measurement) I, against focus f. In this context, largely unprocessed refers to having not undergone the data processing described below to yield a suitable monotonic focus response, this data may have undergone conventional processing such as averaging and/or normalization etc. FIG. 4(a) shows the focus responses for the HH and VV co-polarization states and FIG. 4(b) shows the focus responses for the HV and VH cross-polarization states. In each case a Bossung response is observed in a similar manner as present CD focus metrology techniques, and therefore will suffer from the same inherent problems (lack of sensitivity around best focus bf (i.e., zero defocus) and no sign information). As such, these measurements are not particularly useful in this state for creating a focus model. However, with suitable processing of the intensity data, and in particular the intensity data relating to the HV and VH cross-polarization states (for this example), a suitable monotonic focus response can be obtained.

Figure 4A:
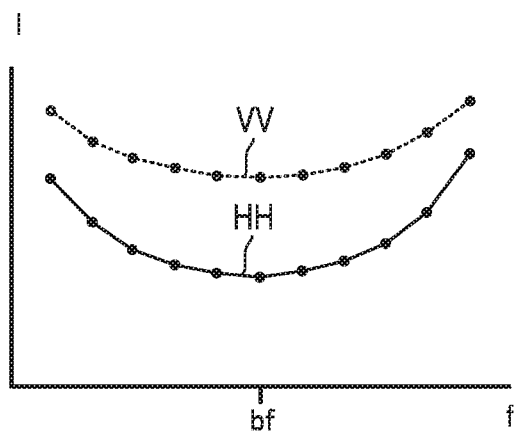
FIGS. 4(a)-4(d) comprise 4(a) plots of HH and VV polarization state measurements based on largely unprocessed intensity data, 4(b) plots of HV and VH polarization state measurements based on largely unprocessed intensity data, 4(c) plots of HH and VV polarization state measurements based on processed intensity data, and 4(d) plots of HV and VH polarization state measurements based on processed intensity data.
Figure 4B:
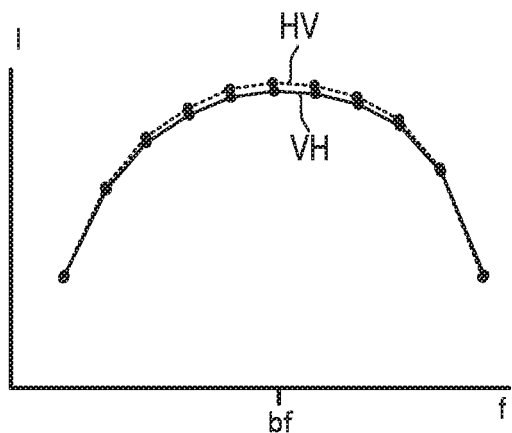
Figure 4C:
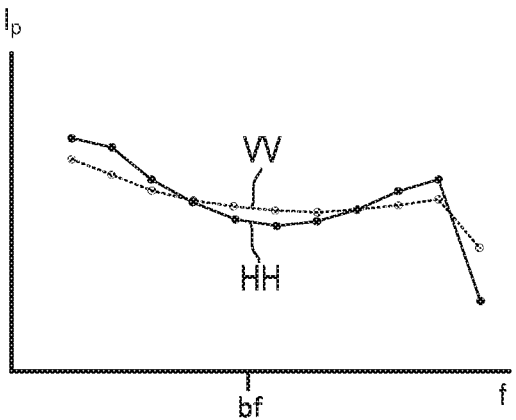
Figure 4D:
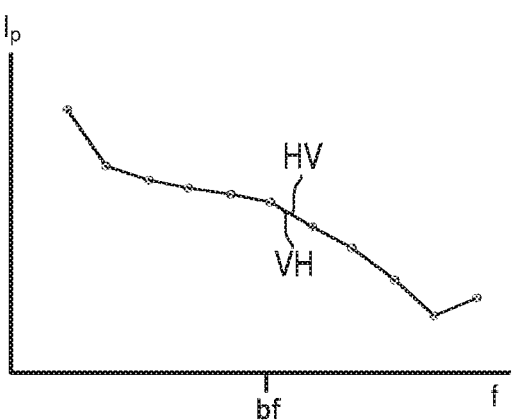

FIGS. 4(c) and 4(d) relate to the same process metric data/measurement data (e.g., intensity data) as shown respectively, in FIGS. 4(a) and 4(b), but subsequent to processing of this data. FIG. 4(c) is a plot of the processed measurement data (e.g., processed intensity metric) Ip against focus for the HH and VV co-polarization states and FIG. 4(d) is a plot of the processed measurement data (e.g., processed intensity metric) Ip against focus for the HV and VH cross-polarization states. In this specific embodiment, the processing comprises performing a principal component analysis (PCA), and the plot relates to the score of a particular principal component. Here, the plot relates to the second principal component, although any principal component which shows a suitable (e.g., the best) focus response could be used, or more than one principal components could form the basis of the focus model. As can be seen, while the two HH and VV co-polarization states in FIG. 4(c) still show a largely Bossung response, the HV and VH cross-polarization states in FIG. 4(d) each show a monotonic response with focus over a suitable (i.e., sufficiently large) focus range around best focus bf. Therefore, this processed data relating to the HV and VH cross-polarization states is particularly suitable for creating a focus model.

It should be appreciated that it is not necessarily the case that the best response will be observed for the HV and VH cross-polarisation states. As such, one or both of the (processed) signal of the HH and VV co-polarization states may also be used (either as an alternative to the HV and VH cross-polarisation states, or in combination with (one or both of) the HV and VH cross-polarisation states) for creating the focus model, depending on the stack, target and/or acquisition settings. Note that in this specific example, the two plots HV and VH in FIG. 4(d) are near identical such that they appear as one, although this will not necessarily be the case.

It should be appreciated that PCA is only one example of signal processing usable in the methods disclosed herein. Other suitable methods may comprise, for example independent component analysis (ICA) or probabilistic latent semantic analysis (PLSA). Advanced mathematical algorithms, including machine learning algorithms, may alternatively or additionally be used. Many different artificial intelligence AI techniques, known collectively as machine learning, can be utilized. Such techniques may be linear, e.g., Partial Least Squares Regression (PLSR), or non-linear, e.g., Support Vector Machines (SVM) which utilize non-linear kernels.

Figure 5:
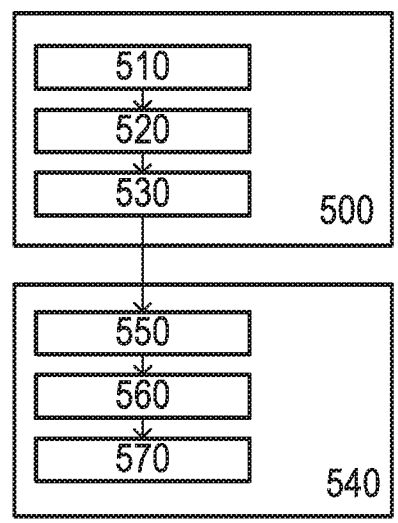
FIG. 5 is a flowchart describing a method according to an embodiment of the invention.

FIG. 5 is a flowchart describing the basic steps of a proposed focus metrology method. A calibration stage 500 comprises an FEM exposure step 510. At this step 510, an FEM (or alternatively a production substrate such as exposed at step 550) is exposed using a reticle with a plurality of line-space targets having various pitches and CDs. The various line-space targets may be provided in order to determine one or more preferred targets for production monitoring. Such a preferred target may comprise a target having good focus sensitivity and low dose crosstalk. In addition, it is also possible that two or more CD/pitch combinations are used to create a focus model so as to suppress the process impact. The model may be trained for (e.g., expected) process variations (e.g., targets subject to different process variations in their formation) to provide process-robustness in the model (for a target or combination of targets). In this manner, it is proposed that the focus model can be improved and simplified by providing such target diversity, thereby providing a focus model which is more robust to dose and/or process variations.

At step 520, the FEM is measured with a cross-polarization or polarimetric metrology function to obtain measurements relating to at least one cross-polarization state (e.g., HV and/or VH states). Preferably, this step will yield equivalent measurements in each of the HV and VH states, and more preferably still in each of HV, VH, HH and VV states (full polarimetric measurement).

At step 530, a focus model is created based on the measurements performed at step 520, and known focus values (e.g., actual focus settings from the lithography apparatus during exposure of the FEM). The focus model may be created using measurements relating to both of the cross-polarization states, although creating a model from only one of the cross-polarization states is also possible and within the scope of the disclosure (e.g., the state which shows the best monotonic focus response). The measurements relating to the co-polarization states may also be used in creating the focus model (in combination or as an alternative depending on the relevant focus responses observed). As explained above, this step may include an initial processing step to obtain a suitable monotonic focus response for at least one of the polarization states. Any of the aforementioned processing methods, e.g., PCA, ICA, PLSA, PSLR, SVM or any other suitable processing method can be used.

In a production stage 540, a production substrate (or other focus monitoring substrate) is exposed 550 with one or more target(s) having the same characteristics as those used to create the focus model. At step 560, a focus monitoring measurement is performed on the target(s) using the same polarization mode(s) as used to create the focus model, e.g., a polarimetric metrology measurement. At step 570, the focus value (of the lithography apparatus when forming the target) is inferred from the measurement data (e.g., intensity data), using the focus model created at step 530. For the specific example illustrated by FIG. 4, this inference may be based in particular, on the measurement data corresponding to the HV and VH cross-polarization states; however this will depend on which polarization state(s) shows the best focus response for a particular situation, and therefore for which the focus model has been created.

It should be noted that the metrology may comprise measurement of structures formed in resist (after develop inspection ADI) or after etch (after etch inspection AEI). In the case of AEI, steps 510 to 530 would need to have been similarly performed after-etch, to obtain an after-etch focus model.

Further embodiments are disclosed in the subsequent list of numbered clauses:

1. A method of measuring a focus parameter relating to formation of a structure using a lithographic process, wherein said method comprises:
obtaining measurement data relating to a cross-polarized measurement of said structure, and
determining a value for said focus parameter based on the measurement data.

2. A method as defined in clause 1, wherein said measurement data comprises one or more of HV polarization state measurement data, VH polarization state measurement data, HH polarization state measurement data and VV polarization state measurement data.

3 A method as defined in clause 2, wherein said measurement data comprises at least said HV polarization state measurement data and/or said VH polarization state measurement data.

4. A method as defined in clause 3, wherein said measurement data comprises said HH polarization state measurement data and/or said VV polarization state measurement data.

5. A method as defined in any preceding clause, wherein said structure comprises a line-space grating.

6. A method as defined in any preceding clause, wherein said line-space grating is designed to be substantially symmetrical.

7. A method as defined in any preceding clause, comprising performing said cross-polarized measurement of said structure on a production substrate.

8. A method as defined in any preceding clause, wherein said determining step is performed using a focus model.

9. A method as defined in clause 8, wherein the focus model is created in a calibration stage using calibration measurement data, relating to a cross-polarized calibration measurement of an exposure matrix, said exposure matrix comprising at least a calibration structure exposed in multiple exposures with a plurality of different focus offsets.

10. A method as defined in clause 9, wherein the exposure matrix comprises multiple exposures having a plurality of different dose offsets, and said step of creating a focus model comprises creating a focus dose model which is further operable to enable determination of a dose parameter based on said measurement data.

11. A method as defined in clause 9 or 10, wherein each of said multiple exposures comprises a plurality of calibration structures, each calibration structure comprising a line-space grating, wherein the pitch and/or critical dimension is varied between calibration structures.

12. A method as defined in any of clauses 9 to 11, wherein the calibration measurement data comprises one or more of HV polarization state calibration measurement data relating to a HV polarization state calibration measurement, VH polarization state calibration measurement data relating to a VH polarization state calibration measurement, HH polarization state calibration measurement data relating to a HH polarization state calibration measurement and VV polarization state calibration measurement data relating to a VV polarization state calibration measurement.

13. A method as defined in clause 12, wherein the cross polarized calibration measurement data comprises at least two of the HV polarization state calibration measurement data, the VH polarization state calibration measurement data, the HH polarization state calibration measurement data and the VV polarization state calibration measurement data.

14. A method as defined in clause 13, wherein the calibration measurement data comprises at least the HV polarization state calibration measurement data and/or VH polarization state calibration measurement data.

15. A method as defined in clause 14, wherein the calibration measurement data further comprises the HH polarization state calibration measurement data and/or the VV polarization state calibration measurement data.

16. A method as defined in any of clauses 13 to 15, wherein the calibration measurement data used to calibrate said focus model is weighted in favor of or solely comprises said calibration measurement data which relates to any of said polarization states that have a monotonic relationship with the focus parameter in at least a focus range around best focus sufficient for monitoring of focus in a lithographic process, whether subsequent to a processing step or otherwise.

17. A method as defined in any of clauses 8 to 16, comprising the step of processing said calibration measurement data to obtain processed calibration measurement data, said processed calibration measurement data having a monotonic relationship with the focus parameter in at least a focus range around best focus sufficient for monitoring of focus in a lithographic process.

18. A method as defined in clause 17, wherein said processed calibration measurement data comprises one or more principal or independent components, and/or scores thereof, of calibration measurement data following a principal or independent component analysis.

19. A method as defined in clause 17 or 18, wherein said processing comprises applying one or more machine learning algorithms, such as a Partial Least Squares Regression or non-linear a Support Vector Machines algorithm.

20. A method as defined in any of clauses 16 to 19, wherein a focus range around best focus sufficient for monitoring of focus in a lithographic process comprises a range between 200 nm and 50 nm around best focus.

21. A computer program comprising program instructions operable to perform the method of any of clauses 1 to 20, when run on a suitable apparatus.

22. A non-transient computer program carrier comprising the computer program of clause 21.

23. A processing system comprising a processor and the computer program of clause 22.

24. A metrology system comprising:
a substrate holder for a substrate;
an illumination source for illuminating a structure on the substrate with radiation with an illumination polarization state selectable between a first polarization state and a second polarization state;
a sensor for sensing scattered illumination from the structure with a sensing illumination state selectable between said first polarization state and said second polarization state; and
the processing system of clause 23.

25. The metrology system of clause 24 where said first polarization state is a horizontal polarization state and said second polarization state is a vertical polarization state.

While the above description describes corrections for a lithographic apparatus/scanner, the determined corrections may also be used for any process and by any integrated circuit (IC) manufacturing apparatus in an IC manufacturing process, e.g., an etch apparatus, which has an effect on the position and/or a dimension of the structures formed within a layer.

The terms "radiation" and "beam" used in relation to the lithographic apparatus encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method of measuring a focus parameter relating to formation of a structure using a lithographic process, wherein the method comprises:
obtaining calibration measurement data relating to a cross-polarized calibration measurement of an exposure matrix using a metrology system;
processing the calibration measurement data to obtain a focus model based on the processed calibration measurement data having a monotonic relationship with the focus parameter in at least a focus range around zero defocus;
obtaining measurement data relating to a cross-polarized measurement of the structure using the metrology system; and
determining a value for the focus parameter based on the measurement data and the focus model.

2. The method claim 1, wherein the measurement data comprises one or more of HV polarization state measurement data, VH polarization state measurement data, HH polarization state measurement data, and VV polarization state measurement data.

3. The method of claim 1, wherein the obtaining the measurement data comprises obtaining measurement data relating to a cross-polarized measurement of the structure comprising a line-space grating.

4. The method of claim 1, wherein the obtaining the measurement data comprises obtaining measurement data relating to a cross-polarized measurement of the structure's line-space grating line-space that is substantially symmetrical.

5. The method of claim 1, further comprising performing the cross-polarized measurement of the structure on a production substrate.

6. The method of claim 1, wherein the calibration measurement data comprises one or more of HV polarization state calibration measurement data relating to a HV polarization state calibration measurement, VH polarization state calibration measurement data relating to a VH polarization state calibration measurement, HH polarization state calibration measurement data relating to a HH polarization state calibration measurement, and VV polarization state calibration measurement data relating to a VV polarization state calibration measurement.

7. The method of claim 1, wherein the processed calibration measurement data comprises one or more principal or independent components, and/or scores thereof, of calibration measurement data following a principal or independent component analysis.

8. The method claim 1, wherein the obtaining the focus model is further based on the exposure matrix comprising calibration structures formed by exposures associated with different focus offsets.

9. The method claim 8, further comprising determining a value for a dose parameter based on the measurement data and a focus dose model, wherein the obtaining the focus model comprises obtaining the focus dose model based on the exposure matrix further comprising calibration structures formed by exposures associated with different dose offsets.

10. The method claim 8, wherein the obtaining the focus model is further based on a pitch and/or critical dimension of a line-space grating of one of the calibration structures being different from a pitch and/or critical dimension of a line-space grating of another of the calibration structures.

11. A non-transitory computer-readable storage device having instructions stored thereon, execution of which, by a computing device, cause the computing device to perform the method of claim 1.

12. A processing system comprising the computing device and the non-transitory computer-readable storage device of claim 11.

13. A metrology system comprising:
a substrate holder configured to support a substrate;
an illumination source having a selectable illumination polarization state and configured to illuminate a structure on the substrate with radiation, wherein the selectable illumination polarization state is selectable from a first polarization state and a second polarization state;

a sensor configured to sense scattered illumination from the structure with a sensing illumination state selectable from the first polarization state and the second polarization state; and the processing system of claim 12.

* * * * *